United States Patent
Hayashi

(10) Patent No.: US 8,377,251 B2
(45) Date of Patent: Feb. 19, 2013

(54) SPIN PROCESSING APPARATUS AND SPIN PROCESSING METHOD

(75) Inventor: Konosuke Hayashi, Yokohama (JP)

(73) Assignee: Shibaura Mechatronics Corporation, Yokohama-Shi (JP)

( * ) Notice: Subject to any disclaimer, the term of this patent is extended or adjusted under 35 U.S.C. 154(b) by 19 days.

(21) Appl. No.: 12/960,699

(22) Filed: Dec. 6, 2010

(65) Prior Publication Data
US 2011/0073565 A1    Mar. 31, 2011

Related U.S. Application Data

(63) Continuation of application No. PCT/JP2009/061501, filed on Jun. 24, 2009.

(30) Foreign Application Priority Data

Jun. 30, 2008 (JP) ................................. 2008-170306

(51) Int. Cl.
*C23F 1/00* (2006.01)
*H01L 21/306* (2006.01)

(52) U.S. Cl. ............................. 156/345.18; 156/345.11

(58) Field of Classification Search .................... 216/83; 156/345.18, 345.11
See application file for complete search history.

(56) References Cited

U.S. PATENT DOCUMENTS

| | | | |
|---|---|---|---|
| 6,672,318 | B1 | 1/2004 | Tsuchiya et al. |
| 2004/0050491 | A1 | 3/2004 | Miya et al. |
| 2004/0226582 | A1 | 11/2004 | Satoshi et al. |
| 2007/0175500 | A1 | 8/2007 | Hohenwarter |

FOREIGN PATENT DOCUMENTS

| | | |
|---|---|---|
| JP | 5190442 | 7/1993 |
| JP | 2005190442 | * 7/1993 |
| JP | 05283395 A | 10/1993 |
| JP | 2000183010 A | 6/2000 |
| JP | 2001267278 | 9/2001 |
| JP | 2003297801 | * 10/2003 |
| JP | 20030297801 | 10/2003 |
| JP | 2004265912 | 9/2004 |
| JP | 2005190442 | 7/2005 |
| JP | 2004335956 | 6/2006 |
| TW | 200405451 A | 4/2004 |
| TW | 200616138 A | 5/2006 |
| TW | 200826182 A | 6/2008 |

OTHER PUBLICATIONS

JP 2003297801 abstract translation (2003) 1 page.*

(Continued)

*Primary Examiner* — Nadine G Norton
*Assistant Examiner* — Mahmoud Dahimene
(74) *Attorney, Agent, or Firm* — Volpe and Koenig, P.C.

(57) ABSTRACT

A cup member, a rotary table which is provided in the cup member and is driven to rotate, holding the substrate, a treatment liquid receiver which has a ring shape open upward and is provided to be movable in vertical directions, between inner circumference of the cup member and outer circumference of the rotary table, to receive the plurality of kinds of treatment liquids scattering from the substrate rotating, a linear motor which sets the treatment liquid receiver to height levels by driving the treatment liquid receiver in the vertical directions, respectively corresponding to the plurality of types of treatment liquids supplied for the substrate, and first to third separate flow channels which are provided on the cup member and separately collect the treatment liquids received by the treatment liquid receiver, respectively corresponding to the height levels set by the linear motor.

2 Claims, 5 Drawing Sheets

OTHER PUBLICATIONS

International Search Report Issued on Aug. 25, 2009 in Parent International Application No. PCT/JP2009/061501, along with English translation.

Supplementary European Search Report dated Jun. 14, 2012 from counterpart European Patent Application No. 09773359.6 consisting of 7 pages.

Office Action issued in counterpart Chinese Patent Application No. 200980121947.5 on Jun. 14, 2012.

Office Action dated Sep. 14, 2012 from counterpart Taiwanese Patent Application No. 98121872.

* cited by examiner

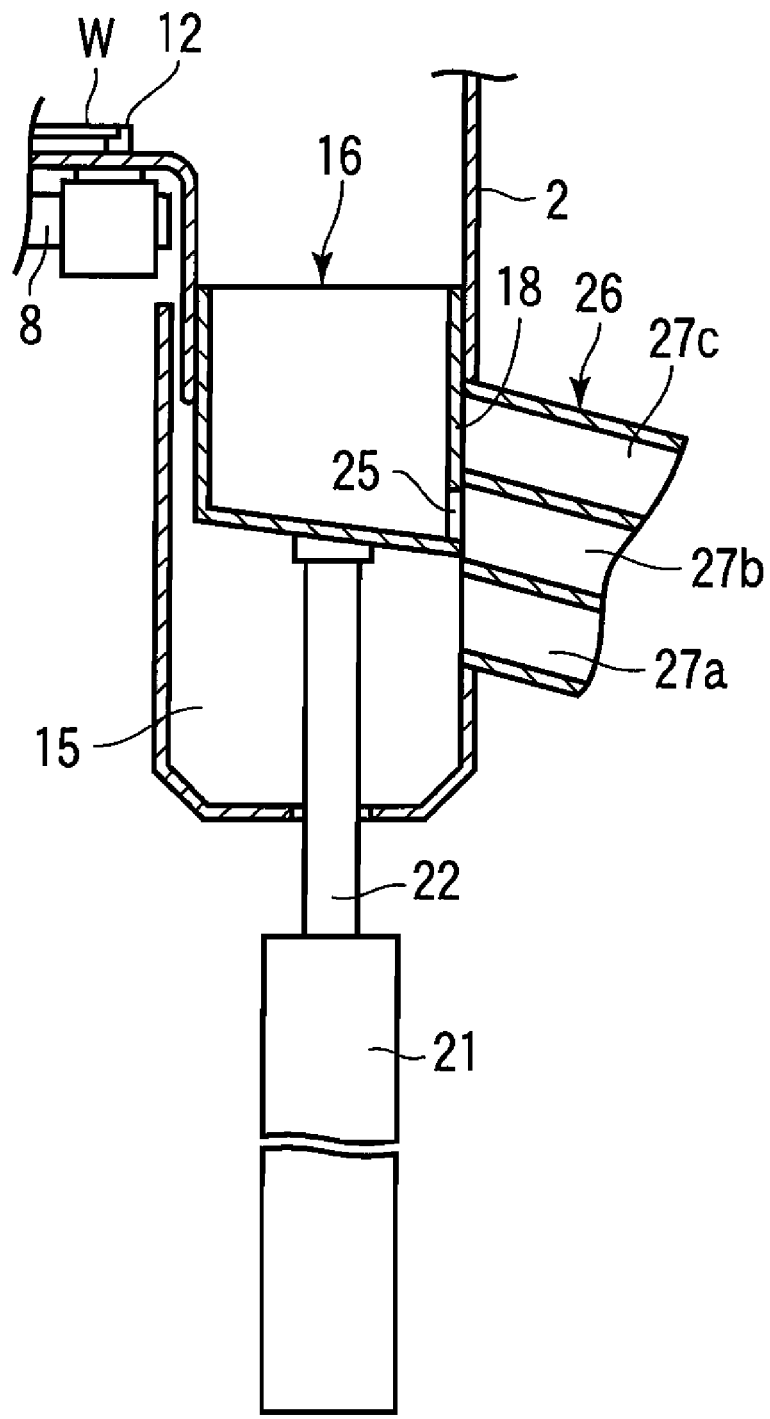
F I G. 3B

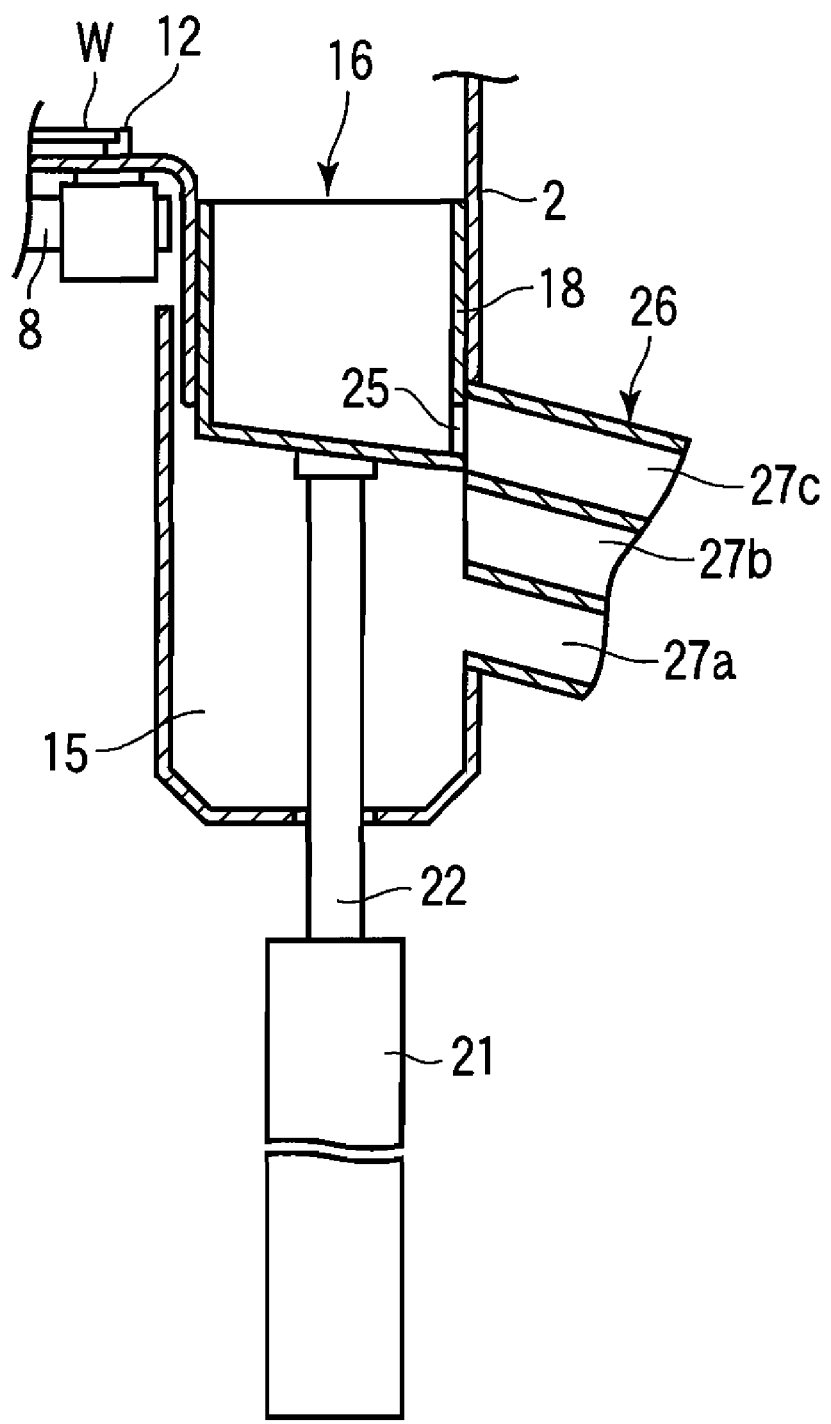
F I G. 3C

SPIN PROCESSING APPARATUS AND SPIN PROCESSING METHOD

CROSS-REFERENCE TO RELATED APPLICATIONS

This application is based upon and claims the benefit of priority from prior Japanese Patent Application No. 2008-170306, filed Jun. 30, 2008, the entire contents of which are incorporated herein by reference.

BACKGROUND OF THE INVENTION

1. Field of the Invention

The present invention relates to a spin processing apparatus and a spin processing method by which a substrate being driven to rotate is sequentially subjected to treatments using plural treatment liquids.

2. Description of the Related Art

For example, in a process of manufacturing a liquid-crystal display device and a semiconductor device, circuit patterns are formed on a substrate, such as a rectangular glass substrate or a semiconductor wafer. When a circuit pattern is formed, a developing treatment, an etching treatment, and a resist separation treatment are preformed on the substrate. When these treatments each are preformed, firstly, a developer, an etchant, or a remover is supplied as a first treatment liquid for the substrate, to perform a predetermined treatment. Subsequently, as a second treatment liquid, a cleaner such as pure water is supplied to perform a cleaning treatment.

The first treatment liquids such as a developer, etchant, and remover are expensive, and are therefore collected afterward and used repeatedly. To repeatedly use such a first treatment liquid, the first treatment liquid need be collected without being mixed with the second treatment liquid.

To avoid mixture of the first and second treatment liquids, the first and second treatment liquids need be collected through respectively different routes.

In some cases, however, a substrate is sequentially processed by plural kinds of first treatment liquids as described above. For example, a substrate subjected to a developing treatment is etched with a etchant, is then cleaned with a cleaner, and is further subjected to a resist separation treatment with a remover. Thereafter, the substrate is cleaned again by a cleaner, and conveyed to a next process.

In such cases, when the etchant and remover are repeatedly used, these treatment liquids each are required to be separated and collected without mixing any other treatment liquid into these treatment liquids.

Conventionally, an apparatus disclosed in Patent Document 1 below is known as a spin processing apparatus which processes a substrate with plural treatment liquids and collects the treatment liquids separated from each other. The spin processing apparatus disclosed in Patent Document 1 is provided with a rotary table which is driven to rotate with a substrate held in a cup member. Plural partitions which are annular relative to radial directions of the rotary table are provided to be movable in vertical directions in the cup member.

Further, when a treatment liquid is supplied for the substrate held on the rotary table to perform a treatment, one of the plural partitions is lifted up. The treatment liquid which scatters due to a centrifugal force generated by rotation of the substrate is thereby made collide with and drop along an inner circumferential surface of the lifted partition.

Collection tubes are connected to bottom parts of the cup respectively corresponding to spaces formed in inner circumferential surfaces of the partitions. Accordingly, treatment liquids which drop into the spaces are separately collected by the collection tubes.

That is, a space into which a treatment liquid scattering from the substrate drops can be set depending on which one of the plural partitions is lifted up. Therefore, plural kinds of treatment liquids which are supplied to a substrate can be collected, separated respectively for the spaces.

PRIOR ART REFERENCE

Patent Document

Patent Document 1: Jpn. Pat. Appln. KOKAI Publication No. 2003-297801

BRIEF SUMMARY OF THE INVENTION

Meanwhile, according to a configuration as described above, a rotation speed of the rotary table varies when the rotary table starts or ends rotating. Therefore, a scattering distance of a treatment liquid which scatters from a substrate varies depending on the rotation speed. That is, when the rotation speed is low, the scattering distance of the treatment liquid is short.

When the scattering distance of the treatment liquid is too short, the treatment liquid scattering from the substrate can not reach an inner circumferential surface of a lifted partition. In such a case, the treatment liquid does not drop into a set space but drops into another space and is collected therefrom.

Further, even when the substrate is rotated at a constant speed, the scattering distance of a treatment liquid scattering from a substrate can vary depending on changes in conditions of supplying the treatment liquid to the substrate. In such a case, the treatment liquid can fail to be collected by dropping the treatment liquid from the substrate into a set space.

Unless a treatment liquid scattering from a substrate can be made drop into a set space, the treatment liquid is mixed with other treatment liquids. Plural kinds of treatment liquids each can not steadily be collected separately.

The invention is to provide a spin processing apparatus and a spin processing method by which, when a substrate is processed with plural kinds of treatment liquids, each of the treatment liquids can steadily be collected separately.

According to the present invention, there is provided a spin processing apparatus which processes a substrate by sequentially supplying a plurality of kinds of treatment liquids for the substrate, the apparatus comprising:

a cup member;

a rotary table which is provided in the cup member and is driven to rotate, holding the substrate;

a treatment liquid receiver which has a ring shape open upward and is provided to be movable in vertical directions, between inner circumference of the cup member and outer circumference of the rotary table, to receive the plurality of kinds of treatment liquids scattering from the substrate rotating;

a vertical drive means which sets the treatment liquid receiver to height levels by driving the treatment liquid receiver in the vertical directions, respectively corresponding to the plurality of types of treatment liquids supplied for the substrate; and a separate collection means which is provided on the cup member and separately collects the treatment liquids received by the treatment liquid receiver, respectively corresponding to the height levels set by the vertical drive means.

The treatment liquid receiver comprises an inner circumferential wall, an outer circumferential wall, and a bottom wall, the bottom wall being inclined relative to radial directions of the cup member, a communicating part being provided in one of the inner and outer circumferential walls positioned at a lower end side of the bottom wall in an inclination direction of the bottom wall, and the communicating part making inside of the cup member to communicate with the separate collection means.

A space is formed between the inner circumference of the cup member and the outer circumference of the rotary table, throughout a whole length in circumferential directions, and the treatment liquid receiver is contained to be vertically movable in the space.

The separate collection means comprises a plurality of separate flow channels provided respectively at height levels which are different from each other in the vertical directions.

According to the present invention, there is provided a spin processing method which processes a substrate by sequentially supplying a plurality of kinds of treatment liquids for the substrate, the method comprising:

driving a rotary table provided in the cup member to rotate, holding the substrate on the rotary table;

supplying the plurality of kinds of treatment liquids for the substrate rotating;

receiving the plurality of kinds of treatment liquids scattering from the substrate, by a treatment liquid receiver, height levels of which are set respectively corresponding to the plurality of kinds of treatment liquids; and separately collecting the treatment liquids received by the treatment liquid receiver, respectively depending on the plurality of kinds.

According to the invention, height levels of a treatment liquid receiver which receives treatment liquids scattering from a substrate are set, and the treatment liquids each received by the treatment liquid receiver are separated depending on the height levels. Therefore, plural kinds of treatment liquids can steadily be collected separately, regardless of scattering distances of treatment liquids scattering from the substrate.

BRIEF DESCRIPTION OF THE SEVERAL VIEWS OF THE DRAWING

FIG. 3B is an explanatory view when the treatment liquid receiver is positioned at a middle level; and FIG. 3C is an explanatory view when the treatment liquid receiver is positioned at an uppermost level.

DETAILED DESCRIPTION OF THE INVENTION

Hereinafter, an embodiment of the invention will be described with reference to the drawings.

Figure 1:
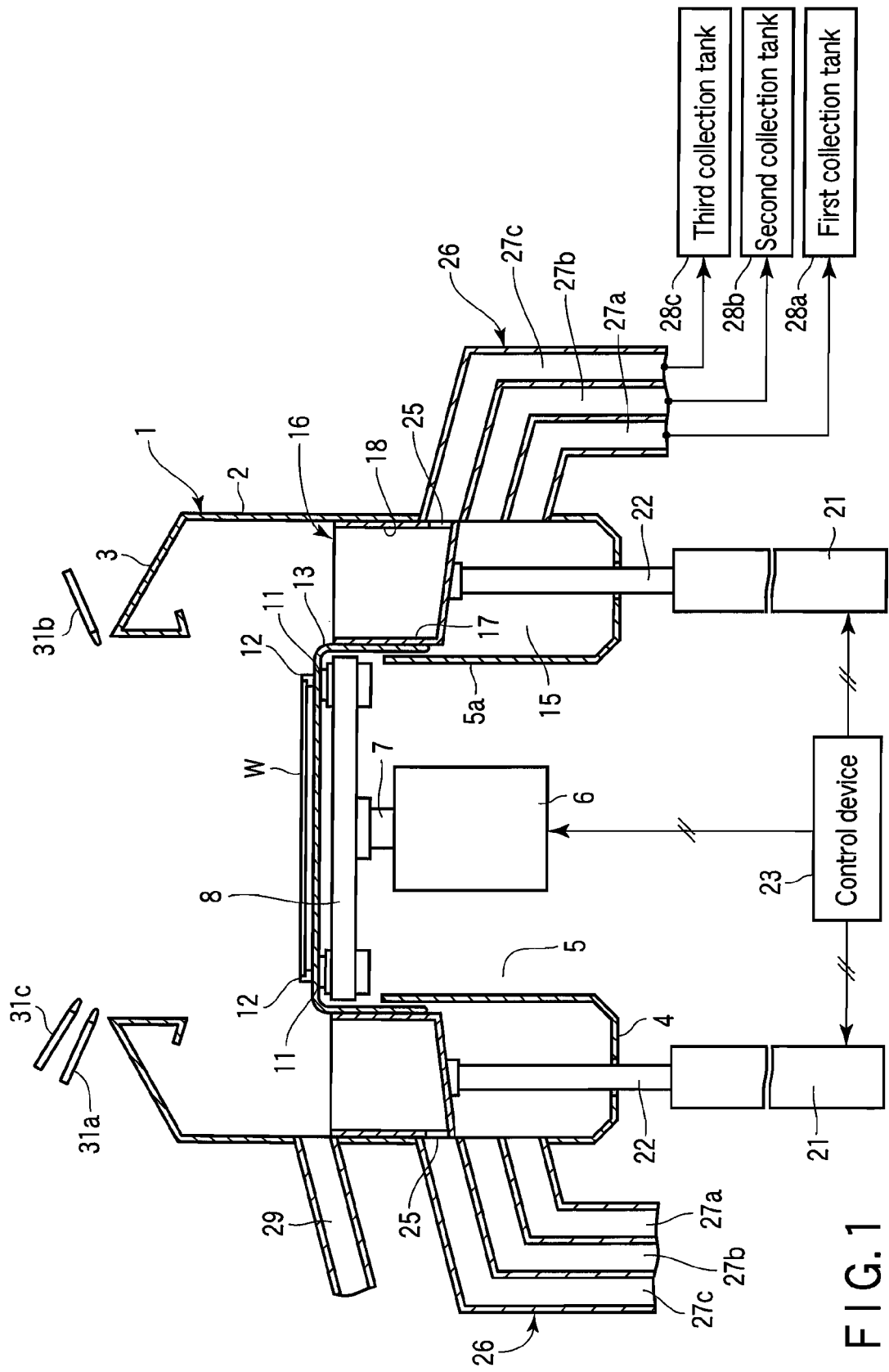
FIG. 1 is a diagram illustrating a schematic configuration of a spin processing apparatus according to an embodiment of the invention.

A spin processing apparatus illustrated in FIG. 1 comprises a cup member 1. The cup member 1 comprises a cylindrical circumferential wall 2, and an inclined wall 3 inclined to a center of radial directions is provided at an upper end of the circumferential wall 2.

A through hole 5 is formed at a center part of a bottom wall 4 of the cup member 1. A drive source 6 is provided in the through hole 5. A rotary table 8 is attached to an upper end of a drive shaft 7 of the drive source 6. Plural support members 11 are provided at predetermined intervals along circumferential directions on a peripheral part of an upper surface of the rotary table 8. An engagement pin 12 which rotates eccentrically is provided on an upper surface of each of the support members 11.

Further, a substrate W such as a semiconductor wafer is provided on the rotary table 8. A peripheral part of the substrate W is engaged with and held by the engagement pin 12. That is, the substrate W is detachably held on the rotary table 8 by eccentrically rotating the engagement pin 12.

The rotary table 8 is provided with a cover 13 to cover its own upper surface and outer circumferential surface. A circumferential wall of the cover 13 is close to and opposed against an inner circumferential surface of an annular wall 5a which is provided to stand, surrounding the through hole 5 formed in the bottom wall 4 of the cup member 1. Therefore, treatment liquids supplied into the cup member 1 are prevented from flowing out through the through hole 5.

In the cup member 1, the circumferential wall 2 thereof and the annular wall 5a constitute a ring space 15 which extends throughout a whole circumferential length, between inner circumference of the cup member 1 and outer circumference of the rotary table 8. A treatment liquid receiver 16 which is formed in a ring shape like the space 15 is contained in the space 15, allowing the treatment liquid receiver 16 to be movable in vertical directions.

Figure 2A:
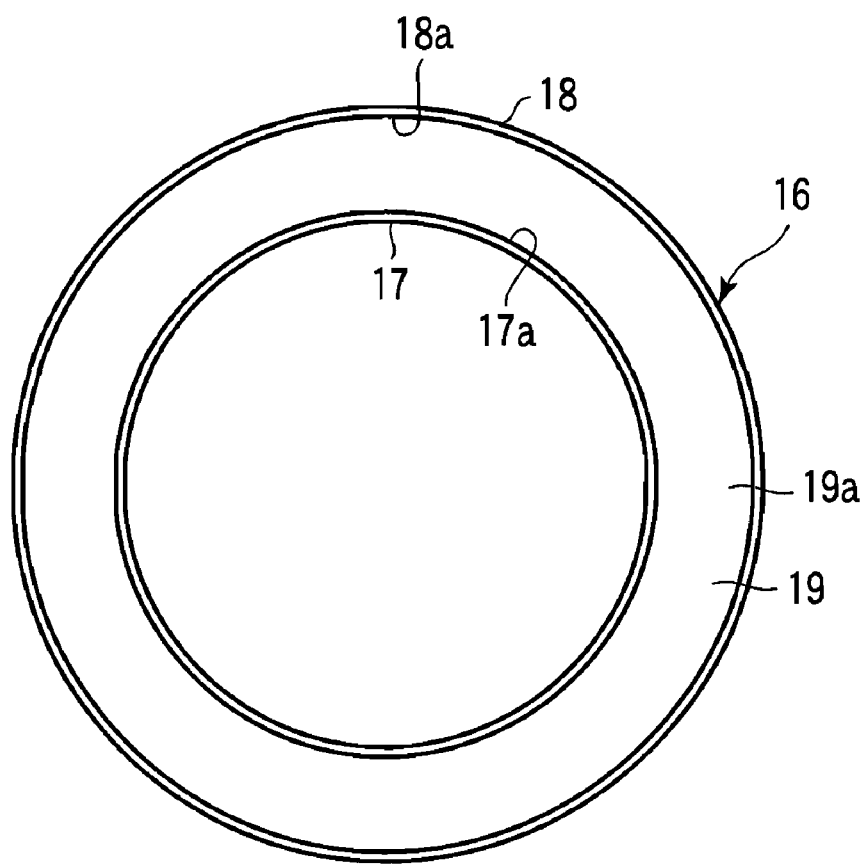
FIG. 2A is a plan view of a treatment liquid receiver.
Figure 2B:
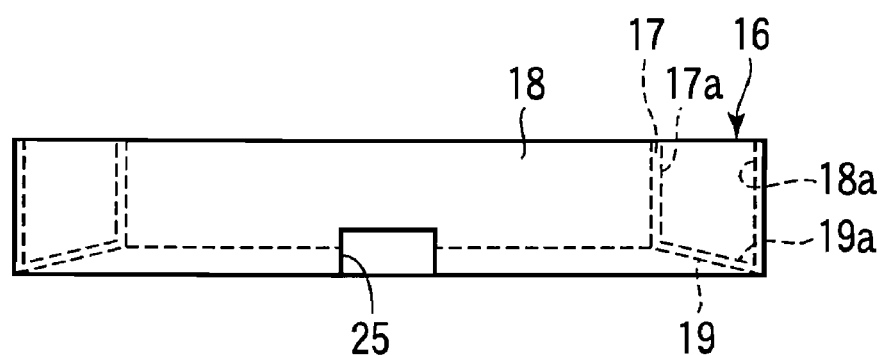
FIG. 2B is a side view of the treatment liquid receiver.

In the treatment liquid receiver 16, an annular inner circumferential wall 17 and an outer circumferential wall 18 are provided coaxially with each other, as illustrated in FIGS. 2A and 2B. Lower ends of the circumferential walls 17 and 18 are linked to each other and closed by a bottom wall 19 while the walls are open to upper sides thereof. The bottom wall 19 is inclined to lower from inside to outside along radial directions of the treatment liquid receiver 16.

The treatment liquid receiver 16 is formed of a material which is entirely water-repellent and chemical-resistant, such as fluororesin. However, the treatment liquid receiver 16 may alternatively formed of a metal material whose surface is entirely coated with a material such as fluororesin. When only surfaces of the treatment liquid receiver 16 are water-repellent, a water-repellent treatment may be performed by coating a material such as fluororesin only on an outer circumferential surface 17a of the inner circumferential wall 17, an inner circumferential surface 18a of the outer circumferential wall 18, and an upper surface of the bottom wall 19, as illustrated in FIGS. 2A and 2B. That is, at least surfaces of the treatment liquid receiver 16 are formed to be water-repellent and chemical-resistant.

Drive shafts 22 of linear motors 21 as vertical drive means are connected to an outer bottom surface of the bottom wall 19 of the treatment liquid receiver 16. Plural linear motors 21 are provided at predetermined intervals along the circumferential directions of the cup member 1. In the present embodiment, two linear motors 21 are provided at intervals of 180 degrees in the circumferential directions. The linear motors 21, as well as the drive source 6 of the rotary table 8, are controlled to drive by a control device 23. Accordingly, a height of the treatment liquid receiver 16 is set to be adjustable in steps in the vertical directions inside the space 15.

In a lower end part of the outer circumferential wall 18 of the treatment liquid receiver 16, outflow pores 25 as four elongate communicating parts are provided at predetermined intervals along the circumferential directions, e.g., at intervals of 90 degrees along the circumferential directions in the present embodiment.

Ends of polygonal cylindrical flow-channel sets 26 are connected to portions of the circumferential wall 2 of the cup member 1, which respectively correspond to the outflow pores 25 of the treatment liquid receiver 16. Inside of each of the flow-channel sets 26 is divided into first to third separate flow channels 27a to 27c, which constitute separate collection means. That is, at an end part of each of the flow-channel sets 26, tip end parts of the first to third separate flow channels 27a to 27c are partitioned from each other in vertical directions.

The treatment liquid receiver 16 is driven in steps in vertical directions so that the outflow pores 25 formed in the outer circumferential wall 18 are sequentially opposed to the first to third separate flow channels 27a to 27c of the flow-channel sets 26. Accordingly, a treatment liquid which flows into the treatment liquid receiver 16 is made flow into the one of the first to third separate flow channels 27a to 27c of each of the flow-channel sets 26, to which the outflow pores 25 are just opposed.

Height dimensions of the separate flow channels 27a to 27c at the tip ends thereof are set to be greater than a height size of the outflow pores 25. Therefore, when the treatment liquid receiver 16 is driven to be positioned at a predetermined height level, the outflow pores 25 are steadily opposed to one of the plural separate flow channels 27a to 27c.

First to third collection tanks 28a to 28b which constitute separate collection means, in conjunction with the separate flow channels 27a to 27c, are connected to the other ends of the first to third separate flow channels 27a to 27c. Therefore, treatment liquids which flow through the separate flow channels 27a to 27c are separately collected in the first to third collection tanks 28a to 28b, respectively.

To the circumferential wall 2 of the cup member 1, ends of plural exhaust pipes 29 (only one of which is illustrated) are connected at predetermined intervals along the circumferential directions, e.g., two exhaust pipes 29 are connected at intervals of 180 degrees in the present embodiment. The other ends of the exhaust pipes 29 are connected to an unillustrated exhaust blower.

Accordingly, an atmosphere in an upper surface side of the substrate W held on the rotary table 8 is discharged through the space 15 in the cup member 1. Thus, since the atmosphere above the upper surface of the substrate W flows, a mist floating in the cup member 1 does not adhere to the upper surface of the substrate W but is smoothly discharged.

Unillustrated shield plates are provided at predetermined intervals, at open ends of the exhaust pipes 29 which are open to an inner surface of the circumferential wall 2, in order that treatment liquids scattering from the substrate W are prevented from entering the exhaust pipes 29.

Treatment liquids are supplied to the upper surface of the substrate W held on the rotary table 8. For example, the treatment liquids are supplied selectively from plural nozzle members provided above the cup member 1, e.g., from three nozzle members 31a to 31c in the present embodiment.

A first nozzle member 31a supplies the first treatment liquid such as a developer, and a second nozzle member 31b supplies the second treatment liquid such as pure water. A third nozzle member 31c supplies the third treatment liquid such as an etchant.

Next, a case of processing the substrate W sequentially with the first to third treatment liquids by the spin processing apparatus configured as described above will be described with reference to FIGS. 3A, 3B, and 3C.

Figure 3A:
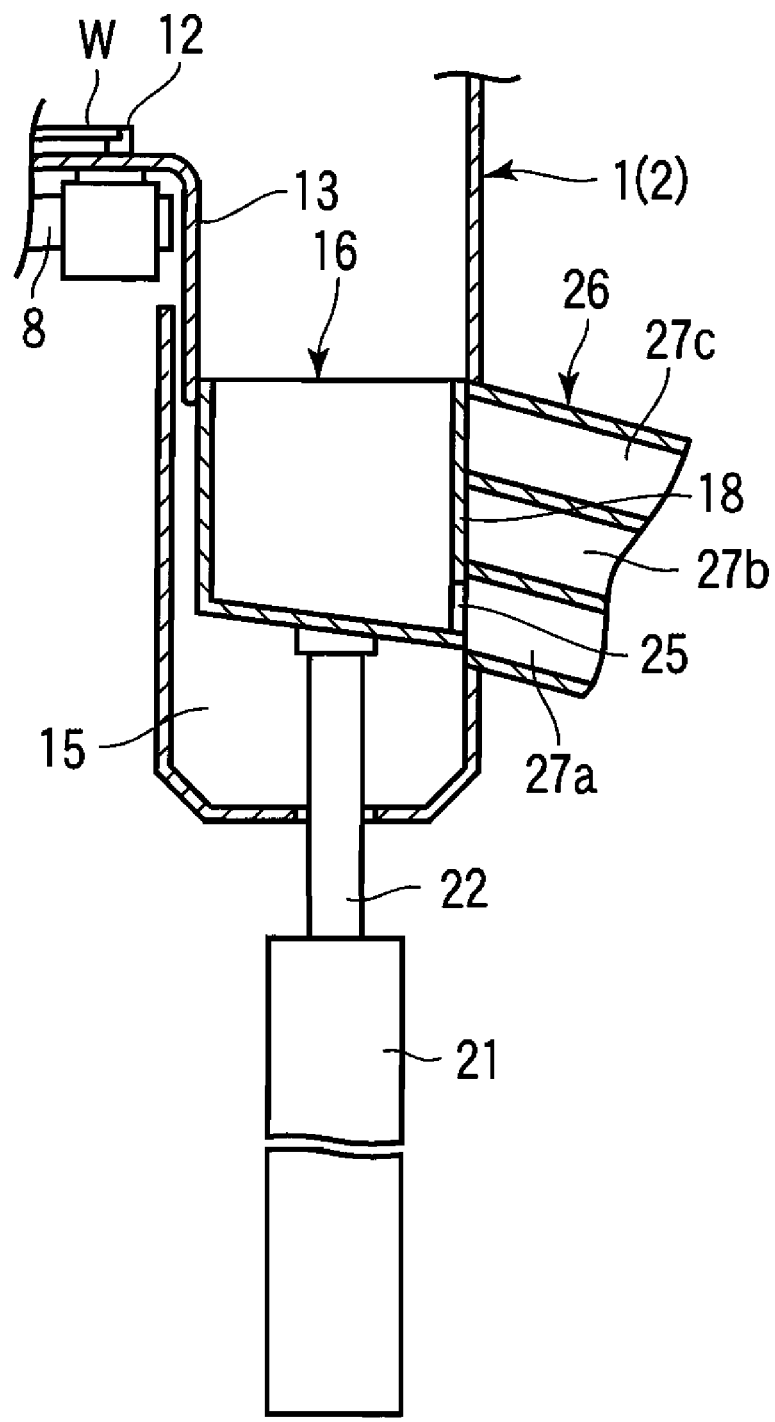
FIG. 3A is an explanatory view when the treatment liquid receiver is positioned at a lowermost level.

At first, as illustrated in FIG. 3A, the treatment liquid receiver 16 is moved down and positioned to a lowermost level by the linear motors 21. The outflow pores 25 formed in the outer circumferential wall 18 are thereby opposed to the lowermost first separate flow channels 27a in the flow-channel sets 26.

In this state, the rotary table 8 holding the substrate W unprocessed is rotated, and a developer as the first treatment liquid is supplied to the substrate W from the first nozzle member 31a. Accordingly, a resist coated on the upper surface of the substrate W is developed with the first treatment liquid.

The first treatment liquid supplied to the substrate W scatters out to periphery from an outer circumferential edge thereof due to a centrifugal force of the rotating substrate W, and flows into inside the treatment liquid receiver 16 from an upper opening thereof, which is positioned at a lowermost height level in the space 15 of the cup member 1. The first treatment liquid which has flowed into the treatment liquid receiver 16 passes through the outflow pores 25 and flows through the first separate flow channels 27a. The first treatment liquid is then collected in the first collection tank 28a connected to the first separate flow channels 27a. That is, the developer as the first treatment liquid can be separately collected in the first collection tank 28a.

After the substrate W is processed with the first treatment liquid, the linear motors 21 are operated to position the treatment liquid receiver 16 to a middle height level, as illustrated in FIG. 3B, and the out flow pores 25 are opposed to the second separate flow channels 27b. After the treatment liquid receiver 16 is positioned at the middle height level, the substrate W is supplied with pure water as the second treatment liquid from the second nozzle member 31b.

The substrate W and the treatment liquid receiver 16 are thereby cleaned with the pure water, which is then collected in the second collection tank 28b through the outflow pores 25 of the treatment liquid receiver 16 and through the second separate flow channels 27b of the flow-channel sets 26. That is, the pure water used for cleaning the substrate W, including the developer, can be separately collected in the second collection tank 28b.

After the substrate W and the treatment liquid receiver 16 are cleaned with pure water, the linear motors 21 are operated to lift up and position the treatment liquid receiver 16 from the middle height level illustrated in FIG. 3B to an uppermost height level illustrated in FIG. 3C. The outflow pores 25 are opposed to the third separate flow channels 27c.

Subsequently, the etchant as the third treatment liquid is injected and supplied to the substrate W from the third nozzle member 31c. Accordingly, a part of the upper surface of the substrate W, where a resist has not been exposed but remains, is etched.

The third treatment liquid supplied to the substrate W is collected in the third collection tank 28a through the outflow pores 25 of the treatment liquid receiver 16 and through the third separate flow channels 27c of the flow-channel sets 26. That is, the etchant as the third treatment liquid can be separately collected without being mixed with any other treatment liquid.

After the substrate W is processed with the etchant as the third treatment liquid, the treatment liquid receiver 16 is set to be positioned at the middle height level by the linear motors 21, as illustrated in FIG. 3B. The substrate W is supplied with pure water as the second treatment liquid from the second nozzle member 31b. Accordingly, the pure water including the developer can be separately collected in the second collection tank 28b.

Thus, according to the spin processing apparatus configured as described above, the first to third treatment liquids can be separately collected into the first to third collection tanks 28a to 28b, respectively. Accordingly, the developer as the first treatment liquid and the etchant as the third treatment liquid, which are expensive treatment liquids, can be reused.

In the space 15 between inner circumference of the cup member 1 and outer circumference of the rotary table 8, the treatment liquid receiver 16 which is open upward is provided at an adjustable height level. Therefore, when a treatment liquid supplied to an upper surface of a substrate W scatters due to a centrifugal force acting on the substrate W, the treatment liquid steadily flows into inside the treatment liquid receiver 16 from an upper side thereof, regardless of the scattering distance from the substrate W.

Further, the treatment liquid which has flowed into the treatment liquid receiver 16 flows out from the outflow pores 25 in the outer circumferential wall 18 through ones of the first to third separate flow channels 27a to 27c which correspond to the height level at which the treatment liquid receiver 16 is set. The treatment liquid is then collected in one of the first to third collection tanks 28a to 28b which is connected to the corresponding ones of the separate flow channels.

That is, different kinds of treatment liquids can steadily be separately collected in the first to third collection tanks 28a to 28b by changing the height levels of the treatment liquid receiver 16, respectively corresponding to the kinds of treatment liquids supplied to the substrate W.

The treatment liquid receiver 16 is formed of a material which is, at least surfaces are formed to be, highly water-repellent. In addition, the bottom wall 19 is inclined to lower to outside in radial directions, i.e., toward the outflow pores 25 formed in the outer circumferential wall 18. Therefore, each treatment liquid which flows into the treatment liquid receiver 16 is collected without adhering to or remaining on surfaces thereof. Accordingly, collection efficiency improves and can raise economic efficiency.

The treatment liquid receiver 16 is provided to be vertically movable, in the space 15 formed between the circumferential wall 2 of the cup member 1 and the outer circumference of the rotary table 8. The outer circumference of the space 15 is covered with the circumferential wall 2 of the cup member 1. Therefore, even when a scattering distance of a treatment liquid scattering from a rotating substrate W increases, the scattering treatment liquid collides with the circumferential wall 2 and then drops therefrom. Accordingly, treatment liquids each can steadily be caught and collected by the treatment liquid receiver 16.

In the embodiment described above, a substrate and the treatment liquid receiver are cleaned with pure water, whenever a treatment liquid to be supplied to a substrate is changed. However, treatment liquids hardly remain on the upper surface of the substrate due to a centrifugal force. Besides, at least surfaces of the treatment liquid receiver are made of a water-repellent material, and treatment liquids also hardly stick to or remain on the surfaces. Therefore, if decrease in purity of treatment liquids to be collected is acceptable to some extent, the substrate or the treatment liquid receiver need not be cleaned with pure water each time a kind of treatment liquid is changed to another kind.

Not only a developer and an etchant but also a remover may be supplied as the treatment liquids to substrates. Alternatively, the invention is applicable even when plural kinds of treatment liquids other than the etchant and remover are supplied.

When the kinds of treatment liquids increase, not only the number of nozzle members but also the number of separate flow channels formed in each flow-channel set are increased in accordance with increase in number of the kinds of treatment liquids. In this case, the treatment liquid receiver is positioned in vertical directions by the linear motors, so as to correspond to the number of separate flow channels.

The flow-channel sets constituting separate collection means are provided on the outer circumferential surface of the cup member. However, the flow-channel sets may alternatively be provided on the inner circumferential surface thereof where the through hole 5 is formed. In this case, the bottom wall of the treatment liquid receiver is inclined to lower toward inside of the cup member in radial directions of the cup member, and the outflow pores may be formed in the inner circumferential wall.

The inner surface of the treatment liquid receiver may be subjected to a water-repellent treatment in order that treatment liquids hardly adhere to or remain on the inner surface. Then, treatment liquids which enter the treatment liquid receiver can be made flow out into the separate flow-channels of the flow channel sets even when the bottom wall of the treatment liquid receiver is not inclined but is horizontal.

EXPLANATION OF REFERENCE SYMBOLS

1 . . . Cup member, 8 . . . Rotary table, 15 . . . Space, 16 . . . Treatment liquid receiver, 17 . . . Inner circumferential wall, 18 . . . Outer circumferential wall, 19 . . . Bottom wall, 21 . . . Linear motor (vertical drive means), 25 . . . outFlow pores (communicating part), 26 . . . Flow-channel sets, 27a to 27c . . . First to third separate flow channels (separate collection means), 28a to 28c . . . First to third collection tanks (separate collection means), 31a to 31c . . . First to third nozzle members.

What is claimed is:

1. A spin processing apparatus which processes a substrate by sequentially supplying a plurality of kinds of treatment liquids for the substrate, the apparatus comprising:
   a cup member;
   a rotary table which is provided in the cup member and is driven to rotate, holding the substrate;
   a treatment liquid receiver which has a ring shape open upward and is provided to be movable in vertical directions, between an inner circumference of the cup member and an outer circumference of the rotary table, to receive the plurality of kinds of treatment liquids scattering from the substrate rotating;
   a vertical drive means which sets the treatment liquid receiver to height levels by driving the treatment liquid receiver in the vertical directions, respectively corresponding to the plurality of types of treatment liquids supplied for the substrate; and
   a separate collection means which is provided on the cup member and separately collects the treatment liquids received by the treatment liquid receiver, respectively corresponding to the height levels set by the vertical drive means, wherein
   the treatment liquid receiver comprises an inner circumferential wall, an outer circumferential wall, and a bottom wall, the bottom wall being inclined relative to radial directions of the cup member, a communicating part being provided in one of the inner and outer circumferential walls positioned at a lower end side of the bottom wall in an inclination direction of the bottom wall, and the communicating part making inside of the cup member to communicate with the separate collection means,
   the separate collection means comprises a plurality of separate flow channels provided respectively at height levels which are different from each other in vertical directions on a circumferential wall of the cup member, and
   a height dimension at a tip end of each of the separate flow channels is set to be greater than a height dimension of the communicating part, whereby, when the treatment liquid receiver is driven to be positioned at a predetermined height level, the communicating part is opposed to only one of the plural separate flow channels.

2. The spin processing apparatus of claim 1, wherein a space is formed between the inner circumference of the cup member and the outer circumference of the rotary table, throughout a whole length in circumferential directions, and the treatment liquid receiver is contained to be vertically movable in the space.

\* \* \* \* \*